US010585795B2

(12) United States Patent
Amato et al.

(10) Patent No.: US 10,585,795 B2
(45) Date of Patent: Mar. 10, 2020

(54) DATA RELOCATION IN MEMORY HAVING TWO PORTIONS OF DATA

(71) Applicant: Micron Technology, Inc., Boise, ID (US)

(72) Inventors: Paolo Amato, Treviglio (IT); Daniele Balluchi, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 15/994,477

(22) Filed: May 31, 2018

(65) Prior Publication Data

US 2019/0370166 A1 Dec. 5, 2019

(51) Int. Cl.
*G06F 12/02* (2006.01)
*G06F 1/3206* (2019.01)
(Continued)

(52) U.S. Cl.
CPC ........ *G06F 12/0246* (2013.01); *G06F 1/3206* (2013.01); *G06F 3/061* (2013.01); *G06F 3/064* (2013.01); *G06F 3/0616* (2013.01); *G06F 3/0647* (2013.01); *G06F 3/0679* (2013.01); *G11C 16/349* (2013.01);
(Continued)

(58) Field of Classification Search
CPC .. G06F 12/0246; G06F 3/0647; G06F 3/0679; G06F 3/0616; G06F 3/061; G06F 3/064; G06F 1/3206; G06F 2212/1032; G06F 2212/7211; G06F 2212/7201; G11C 16/349
See application file for complete search history.

(56) References Cited

U.S. PATENT DOCUMENTS

2010/0329038 A1 12/2010 Roohparvar
2012/0271991 A1 10/2012 Allen et al.
(Continued)

FOREIGN PATENT DOCUMENTS

EP 1713085 A1 10/2006

OTHER PUBLICATIONS

Liao et al., "Adaptive Wear-Leveling in Flash-Based Memory", IEEE Computer Architecture Letters, vol. 14, No. 1, Jan. 2015, pp. 1-4.
(Continued)

*Primary Examiner* — Tasnima Matin
(74) *Attorney, Agent, or Firm* — Brooks, Cameron & Huebsch, PLLC

(57) ABSTRACT

The present disclosure includes apparatuses, methods, and systems for data relocation in memory having two portions of data. An embodiment includes a memory having a plurality of physical blocks of memory cells, and a first and second portion of data having a first and second, respectively, number of logical block addresses associated therewith. Two of the plurality of physical blocks of cells do not have data stored therein. Circuitry is configured to relocate the data of the first portion that is associated with one of the first number of logical block addresses to one of the two physical blocks of cells that don't have data stored therein, and relocate the data of the second portion that is associated with one of the second number of logical block addresses to the other one of the two physical blocks of cells that don't have data stored therein.

24 Claims, 4 Drawing Sheets

(51) Int. Cl.
*G11C 16/34* (2006.01)
*G06F 3/06* (2006.01)

(52) U.S. Cl.
CPC ............... *G06F 2212/1032* (2013.01); *G06F 2212/7201* (2013.01); *G06F 2212/7211* (2013.01)

(56) References Cited

U.S. PATENT DOCUMENTS

| | | |
|---|---|---|
| 2014/0122774 A1 | 5/2014 | Xian et al. |
| 2015/0347294 A1* | 12/2015 | Ruan ................ G06F 13/102 711/103 |
| 2017/0116131 A1 | 4/2017 | Lin |
| 2018/0129423 A1 | 5/2018 | Amato et al. |
| 2018/0129424 A1 | 5/2018 | Confalonieri et al. |
| 2018/0157427 A1* | 6/2018 | Hong ................ G06F 3/0616 |
| 2019/0056888 A1* | 2/2019 | Kwon ................ G06F 3/0659 |

OTHER PUBLICATIONS

Qureshi et al. "Enhancing Lifetime and Security of PCM-Based Main Memory with Start-Gap Wear Leveling" Proceedings of the 42nd Annual IEEE/ACM International Symposium on Microarchitecture, New York, NY, Dec. 2009, 10 pages.
International Search Report and Written Opinion from related International Application No. PCT/US2019/028854, dated Sep. 24, 2019, 9 pages.

* cited by examiner

540 ⟶

| PBA | STEP 0 | STEP 1 | STEP 2 | STEP 3 | STEP 4 | STEP 5 | STEP 6 |
|---|---|---|---|---|---|---|---|
| 0 | A0 | A0 | A0 | A0 | A0 | -- | B0 |
| 1 | A1 | A1 | A1 | A1 | -- | B1 | B1 |
| 2 | A2 | A2 | A2 | -- | B2 | B2 | B2 |
| 3 | A3 | A3 | -- | B0 | B0 | B0 | -- |
| 4 | A4 | -- | B1 | B1 | B1 | -- | A4 |
| 5 | -- | B2 | B2 | B2 | -- | A0 | A0 |
| 6 | B0 | B0 | B0 | -- | A1 | A1 | A1 |
| 7 | B1 | B1 | -- | A2 | A2 | A2 | A2 |
| 8 | B2 | -- | A3 | A3 | A3 | A3 | A3 |
| 9 | -- | A4 | A4 | A4 | A4 | A4 | -- |

|  | STEP 0 | STEP 1 | STEP 2 | STEP 3 | STEP 4 | STEP 5 | STEP 6 |
|---|---|---|---|---|---|---|---|
| $S_A$ | 0 | 0 | 0 | 0 | 0 | 5 | 5 |
| $g_A$ | 5 | 4 | 3 | 2 | 1 | 0 | 9 |
| $g_B$ | 9 | 8 | 7 | 6 | 5 | 4 | 3 |
| $r_B$ | 0 | 1 | 2 | 0 | 1 | 2 | 0 |

*Fig. 5B*

DATA RELOCATION IN MEMORY HAVING TWO PORTIONS OF DATA

TECHNICAL FIELD

The present disclosure relates generally to semiconductor memory and methods, and more particularly, to data relocation in memory having two portions of data.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), and magnetic random access memory (MRAM), among others.

Memory devices can be combined together to form a solid state drive (SSD), an embedded MultiMediaCard (e.MMC), and/or a universal flash storage (UFS) device. An SSD, e.MMC, and/or UFS device can include non-volatile memory (e.g., NAND flash memory and/or NOR flash memory), and/or can include volatile memory (e.g., DRAM and/or SDRAM), among various other types of non-volatile and volatile memory. Non-volatile memory may be used in a wide range of electronic applications such as personal computers, portable memory sticks, digital cameras, cellular telephones, portable music players such as MP3 players, movie players, among others.

Flash memory devices can include memory cells storing data in a charge storage structure such as a floating gate, for instance. Flash memory devices typically use a one-transistor memory cell that allows for high memory densities, high reliability, and low power consumption. Resistance variable memory devices can include resistive memory cells that can store data based on the resistance state of a storage element (e.g., a resistive memory element having a variable resistance).

Memory cells can be arranged into arrays, and memory cells in an array architecture can be programmed to a target (e.g., desired) state. For instance, electric charge can be placed on or removed from the charge storage structure (e.g., floating gate) of a flash memory cell to program the cell to a particular data state. The stored charge on the charge storage structure of the cell can indicate a threshold voltage (Vt) of the cell. A state of a flash memory cell can be determined by sensing the stored charge on the charge storage structure (e.g., the Vt) of the cell.

As an additional example, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell can be determined by sensing current through the cell responsive to an applied interrogation voltage. The sensed current, which varies based on the resistance level of the cell, can indicate the state of the cell.

A single level memory cell (SLC) can be programmed to a targeted one of two different data states, which can be represented by the binary units 1 or 0. Some flash and resistive memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

BRIEF DESCRIPTION OF THE DRAWINGS

FIG. 5A illustrates a conceptual example of a sequence of data relocation operations performed in memory in accordance with an embodiment of the present disclosure.

FIG. 5B is a table of values associated with a sequence of data relocation operations performed in memory in accordance with an embodiment of the present disclosure.

DETAILED DESCRIPTION

Figure 1:
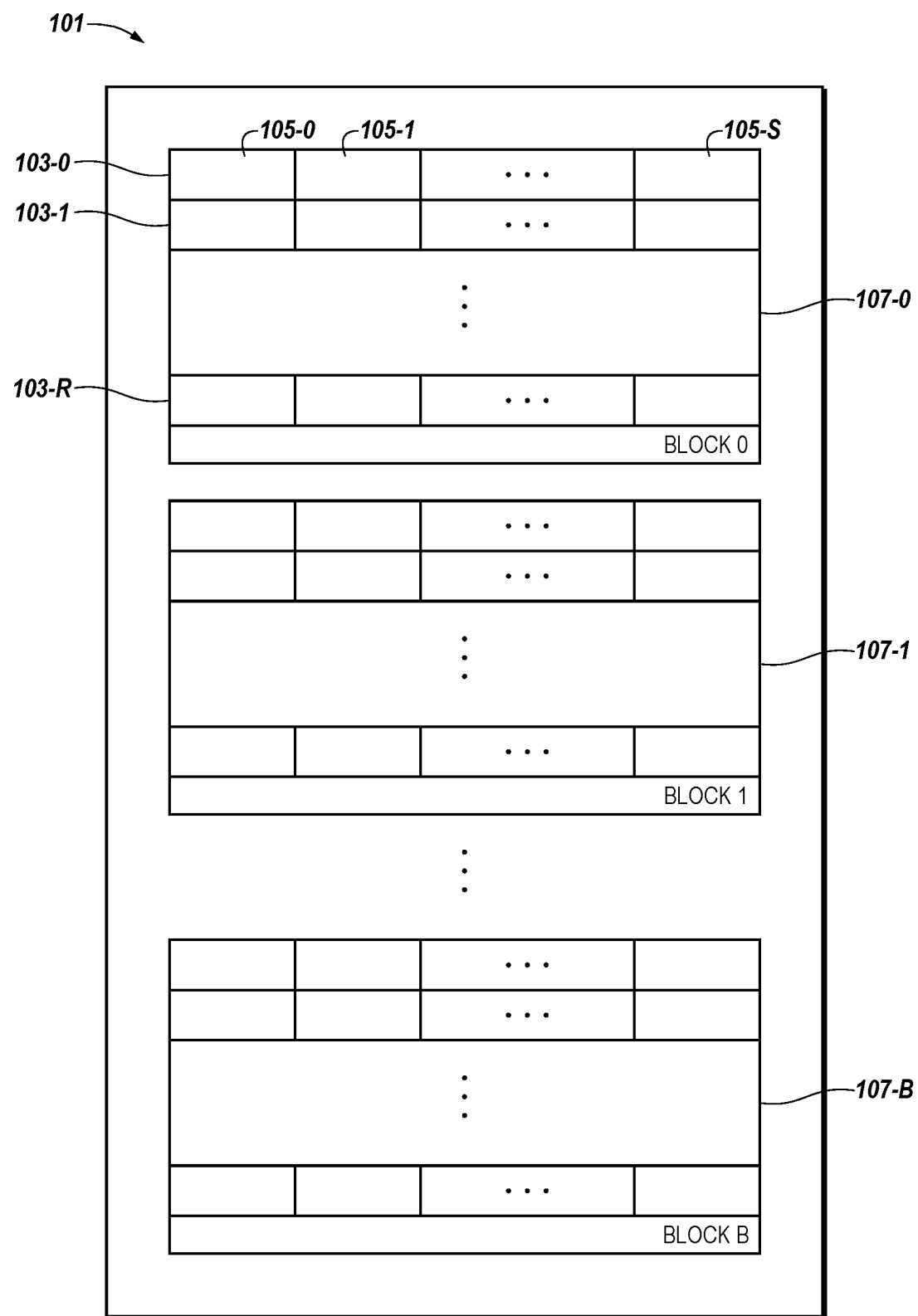
FIG. 1 illustrates a diagram of a portion of a memory array having a number of physical blocks in accordance with an embodiment of the present disclosure.

The present disclosure includes apparatuses, methods, and systems for data relocation in memory having two portions of data. An embodiment includes a memory having a plurality of physical blocks of memory cells, and a first and second portion of data having a first and second, respectively, number of logical block addresses associated therewith. Two of the plurality of physical blocks of cells do not have data stored therein. Circuitry is configured to relocate the data of the first portion that is associated with one of the first number of logical block addresses to one of the two physical blocks of cells that don't have data stored therein, and relocate the data of the second portion that is associated with one of the second number of logical block addresses to the other one of the two physical blocks of cells that don't have data stored therein.

A wear-leveling operation can include and/or refer to an operation to relocate data currently being stored in one physical location of a memory to another physical location of the memory. Performing such wear-leveling operations can increase the performance (e.g., increase the speed, increase the reliability, and/or decrease the power consumption) of the memory, and/or can increase the endurance (e.g., lifetime) of the memory.

Previous wear-leveling operations may use tables to relocate the data in the memory. However, such tables may be large (e.g., may use a large amount of space in the memory), and may cause the wear-leveling operations to be slow. In contrast, operations (e.g., wear-leveling operations) to relocate data in accordance with the present disclosure may maintain an algebraic mapping (e.g., an algebraic mapping between logical and physical addresses) for use in identifying the physical location (e.g., physical block) to which the data has been relocated. Accordingly, operations to relocate data in accordance with the present disclosure may use less space in the memory, and may be faster, than previous wear-leveling operations.

Further, the memory may include (e.g., be separated and/or divided into) two different portions (e.g., logical regions) of data, as will be further described herein. In such instances, previous wear-leveling operations may have to be independently applied to each respective portion of the memory (e.g., separate operations may need to be used for each respective portion), and the data of each respective portion may only be relocated across a fraction of the memory (e.g., the data of each respective portion may remain in separate physical regions of the memory). However, such an approach may be ineffective at increasing the performance and/or endurance of the memory. For instance, since the size of, and/or workload on, the two different logical regions can be different, one of the physical regions may be stressed more than the other one in such an approach.

In contrast, operations (e.g., wear-leveling operations) to relocate data in accordance with the present disclosure may work (e.g., increase performance and/or endurance) more effectively on memory that includes two different portions than previous wear-leveling operations. For example, an operation to relocate data in accordance with the present disclosure may be concurrently applied to each respective portion of the memory (e.g., the same operation can be used on both portions). Further, the data of each respective portion may be relocated across the entire memory (e.g., the data of each respective portion may slide across all the different physical locations of the memory). Accordingly, operations to relocate data in accordance with the present disclosure may be able to account (e.g., compensate) for a difference in size and/or workload of the two portions.

Further, previous wear level operations may not be implementable in hardware. In contrast, operations (e.g., wear-leveling operations) to relocate data in accordance with the present disclosure may be implementable (e.g., completely implementable) in hardware. For instance, operations to relocate data in accordance with the present disclosure may be implementable in the controller of the memory, or within the memory itself. Accordingly, operations to relocate data in accordance with the present disclosure may not impact the latency of the memory, and may not add additional overhead to the memory.

Although embodiments are not limited to a particular type of memory or memory device, operations (e.g., wear-leveling operations) to relocate data in accordance with the present disclosure can be performed (e.g., executed) on a hybrid memory device that includes a first memory array that can be a storage class memory and a number of second memory arrays that can be NAND flash memory. For example, the operations can be performed on the first memory array and/or the second number of memory arrays to increase the performance and/or endurance of the hybrid memory.

As used herein, "a", "an", or "a number of" can refer to one or more of something, and "a plurality of" can refer to one or more such things. For example, a memory device can refer to one or more memory devices, and a plurality of memory devices can refer to two or more memory devices. Additionally, the designators "R", "B", "S", and "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 214 may reference element "14" in FIG. 2, and a similar element may be referenced as 314 in FIG. 3.

FIG. 1 illustrates a diagram of a portion of a memory array 101 having a number of physical blocks in accordance with an embodiment of the present disclosure. Memory array 101 can be, for example, a NAND flash memory array. As an additional example, memory array 101 can be a storage class memory (SCM) array, such as, for instance, a 3D XPoint memory array, a ferroelectric RAM (FRAM) array, or a resistance variable memory array such as a PCRAM, RRAM, or spin torque transfer (STT) array, among others. Memory array 101 can be part of a hybrid memory, as will be further described herein (e.g., in connection with FIG. 2). Further, although not shown in FIG. 1, memory array 101 can be located on a particular semiconductor die along with various peripheral circuitry associated with the operation thereof.

As shown in FIG. 1, memory array 101 has a number of physical blocks 107-0 (BLOCK 0), 107-1 (BLOCK 1), . . . , 107-B (BLOCK B) of memory cells. The memory cells can be single level cells and/or multilevel cells such as, for instance, two level cells, triple level cells (TLCs) or quadruple level cells (QLCs). As an example, the number of physical blocks in memory array 101 may be 128 blocks, 512 blocks, or 1,024 blocks, but embodiments are not limited to a particular power of two or to any particular number of physical blocks in memory array 101.

A number of physical blocks of memory cells (e.g., blocks 107-0, 107-1, . . . , 107-B) can be included in a plane of memory cells, and a number of planes of memory cells can be included on a die. For instance, in the example shown in FIG. 1, each physical block 107-0, 107-1, . . . , 107-B can be part of a single die. That is, the portion of memory array 101 illustrated in FIG. 1 can be a die of memory cells.

As shown in FIG. 1, each physical block 107-0, 107-1, . . . , 107-B includes a number of physical rows (e.g., 103-0, 103-1, . . . , 103-R) of memory cells coupled to access lines (e.g., word lines). The number of rows (e.g., word lines) in each physical block can be 32, but embodiments are not limited to a particular number of rows 103-0, 103-1, . . . , 103-R per physical block. Further, although not shown in FIG. 1, the memory cells can be coupled to sense lines (e.g., data lines and/or digit lines).

As one of ordinary skill in the art will appreciate, each row 103-0, 103-1, . . . , 103-R can include a number of pages of memory cells (e.g., physical pages). A physical page refers to a unit of programming and/or sensing (e.g., a number of memory cells that are programmed and/or sensed together as a functional group). In the embodiment shown in FIG. 1, each row 103-0, 103-1, . . . , 103-R comprises one physical page of memory cells. However, embodiments of the present disclosure are not so limited. For instance, in an embodiment, each row can comprise multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple pages (e.g., logical pages) of data (e.g., an upper page of data and a lower page of data, with each cell in a physical page storing one or more bits towards an upper page of data and one or more bits towards a lower page of data).

In an embodiment of the present disclosure, and as shown in FIG. 1, a page of memory cells can comprise a number of physical sectors 105-0, 105-1, . . . , 105-S (e.g., subsets of memory cells). Each physical sector 105-0, 105-1, . . . , 105-S of cells can store a number of logical sectors of data. Additionally, each logical sector of data can correspond to a portion of a particular page of data. As an example, a first logical sector of data stored in a particular physical sector can correspond to a logical sector corresponding to a first page of data, and a second logical sector of data stored in the particular physical sector can correspond to a second page of data. Each physical sector 105-0, 105-1, . . . , 105-S, can store system and/or user data, and/or can include overhead data, such as error correction code (ECC) data, logical block address (LBA) data, and metadata.

Logical block addressing is a scheme that can be used by a host for identifying a logical sector of data. For example, each logical sector can correspond to a unique logical block address (LBA). Additionally, an LBA may also correspond (e.g., dynamically map) to a physical address, such as a physical block address (PBA), that may indicate the physical location of that logical sector of data in the memory. A logical sector of data can be a number of bytes of data (e.g., 256 bytes, 512 bytes, 1,024 bytes, or 4,096 bytes). However, embodiments are not limited to these examples. Further, in an embodiment of the present disclosure, memory array 101 can be separated and/or divided into a first logical region of data having a first number of LBAs associated therewith, and a second logical region of data having a second number of LBAs associated therewith, as will be further described herein (e.g., in connection with FIG. 2).

It is noted that other configurations for the physical blocks 107-0, 107-1, . . . , 107-B, rows 103-0, 103-1, . . . , 103-R, sectors 105-0, 105-1, . . . , 105-S, and pages are possible. For example, rows 103-0, 103-1, . . . , 103-R of physical blocks 107-0, 107-1, . . . , 107-B can each store data corresponding to a single logical sector which can include, for example, more or less than 512 bytes of data.

Figure 2:
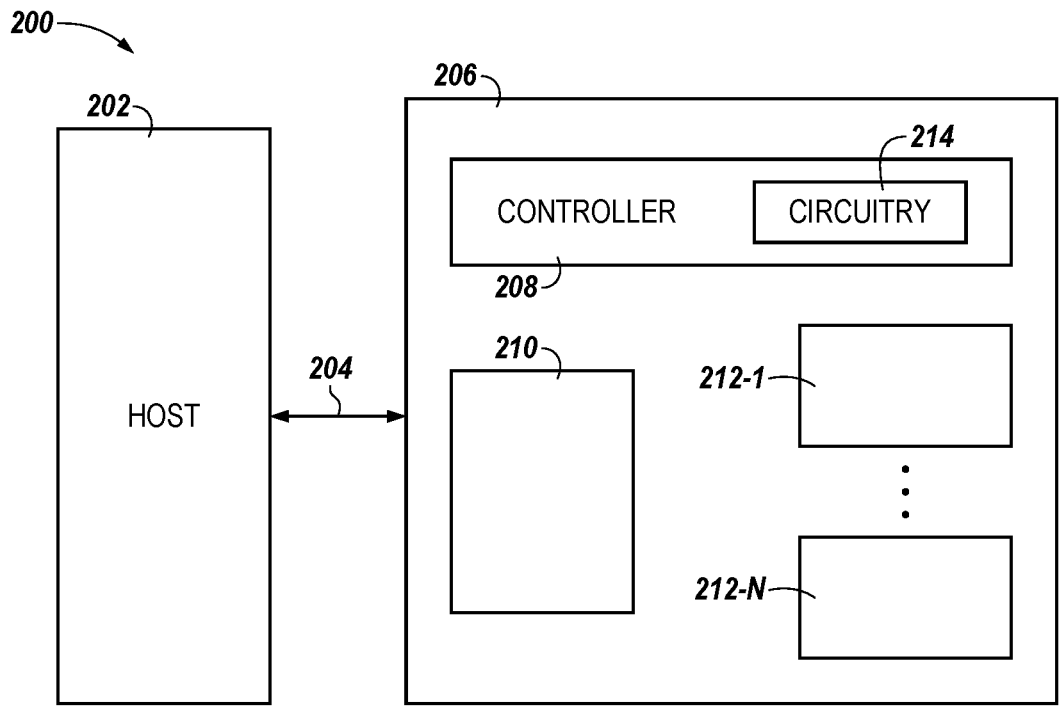
FIG. 2 is a block diagram of a computing system including a host and an apparatus in the form of a memory device in accordance with an embodiment of the present disclosure.

FIG. 2 is a block diagram of a computing system 200 including a host 202 and an apparatus in the form of a memory device 206 in accordance with an embodiment of the present disclosure. As used herein, an "apparatus" can refer to, but is not limited to, any of a variety of structures or combinations of structures, such as a circuit or circuitry, a die or dice, a module or modules, a device or devices, or a system or systems, for example. Further, in an embodiment, computing system 200 can include a number of memory devices analogous to memory device 206.

In the embodiment illustrated in FIG. 2, memory device 206 can include a first type of memory (e.g., a first memory array 210) and a second type of memory (e.g., a number of second memory arrays 212-1, . . . , 212-N). The memory device 206 can be a hybrid memory device, where memory device 206 includes the first memory array 210 that is a different type of memory than the number of second memory arrays 212-1, . . . , 212-N. The first memory array 210 can be storage class memory (SCM), which can be a non-volatile memory that acts as main memory for memory device 206 because it has faster access time than the second number of memory arrays 212-1, . . . , 212-N. For example, the first memory array 210 can be 3D XPoint memory, FRAM, or resistance variable memory such as PCRAM, RRAM, or STT, among others. The second number of memory arrays 212-1, . . . , 212-N can act as a data store (e.g., storage memory) for memory device 206, and can be NAND flash memory, among other types of memory.

Although the embodiment illustrated in FIG. 2 includes one memory array of the first type of memory, embodiments of the present disclosure are not so limited. For example, in an embodiment, memory device 206 can include a number of SCM arrays. However, memory device 206 may include less of the first type of memory than the second type of memory. For example, memory array 210 may store less data than is stored in memory arrays 212-1, . . . , 212-N.

Memory array 210 and memory arrays 212-1, . . . , 212-N can each have a plurality of physical blocks of memory cells, in a manner analogous to memory array 101 previously described in connection with FIG. 1. Further, the memory (e.g., memory array 210, and/or memory arrays 212-1, . . . , 212-N) can include (e.g., be separated and/or divided into) two different portions (e.g., logical regions) of data. For instance, the memory may include a first portion of data having a first number (e.g., first quantity) of logical block addresses (LBAs) associated therewith, and a second portion of data having a second number (e.g., second quantity) of LBAs associated therewith. The first number of LBAs can include, for instance, a first sequence of LBAs, and the second number of LBAs can include, for instance, a second sequence of LBAs.

As an example, the first portion of data may comprise user data, and the second portion of data may comprise system data. As an additional example, the first portion of data may comprise data that has been accessed (e.g., data whose associated LBAs have been accessed) at or above a particular frequency during program and/or sense operations performed on the memory, and the second portion of data may comprise data that has been accessed (e.g., data whose associated LBAs have been accessed) below the particular frequency during program and/or sense operations performed on the memory. In such an example, the first portion of data may comprise data that is classified as "hot" data, and the second portion of data may comprise data that is classified as "cold" data. As an additional example, the first portion of data may comprise operating system data (e.g., operating system files), and the second portion of data may comprise multimedia data (e.g., multimedia files). In such an example, the first portion of data may comprise data that is classified as "critical" data, and the second portion of data may comprise data that is classified as "non-critical" data.

The first and second number of LBAs may be the same (e.g., the first and second portions of data may be the same size), or the first number of LBAs may be different than the second number of LBAs (e.g., the sizes of the first portion of data and the second portion of data may be different). For instance, the first number of LBAs may be greater than the second number of LBAs (e.g., the size of the first portion of data may be larger than the size of the second portion of data). Further, the size of each respective one of the first number of LBAs may be the same as the size of each respective one of the second number of LBAs, or the size of each respective one of the first number of LBAs may be different than the size of each respective one of the second number of LBAs. For instance, the size of each respective one of the first number of LBAs may be a multiple of the size of each respective one of the second number of LBAs. Further, the LBAs associated with each respective portion of the memory can be randomized. For instance, the LBAs can be processed by a static randomizer.

In an embodiment, at least two of the plurality of physical blocks of the memory may not have valid data stored therein. For instance, two of the physical blocks of the memory may be blanks. These physical blocks may separate (e.g., be between) the first portion of data and the second portion of data in the memory. For instance, a first one of these two physical blocks may be after the first portion of data and before the second portion of data, and a second one of the two physical blocks may be after the second portion and before the first portion. These physical blocks may be referred to herein as separation blocks. An example illustrating a memory having two different portions of data separated by two such separation blocks will be further described herein (e.g., in connection with FIG. 4).

As illustrated in FIG. 2, host 202 can be coupled to the memory device 206 via interface 204. Host 202 and memory device 206 can communicate (e.g., send commands and/or data) on interface 204. Host 202 can be a laptop computer, personal computer, digital camera, digital recording and playback device, mobile telephone, PDA, memory card reader, or interface hub, among other host systems, and can include a memory access device (e.g., a processor). One of ordinary skill in the art will appreciate that "a processor" can intend one or more processors, such as a parallel processing system, a number of coprocessors, etc.

Interface 204 can be in the form of a standardized physical interface. For example, when memory device 206 is used for information storage in computing system 200, interface 204 can be a serial advanced technology attachment (SATA) physical interface, a peripheral component interconnect express (PCIe) physical interface, a universal serial bus (USB) physical interface, or a small computer system interface (SCSI), among other physical connectors and/or interfaces. In general, however, interface 204 can provide an interface for passing control, address, information (e.g., data), and other signals between memory device 206 and a host (e.g., host 202) having compatible receptors for interface 204.

Memory device 206 includes controller 208 to communicate with host 202 and with the first memory array 210 and the number of second memory arrays 212-1, . . . , 212-N. Controller 208 can send commands to perform operations on the first memory array 210 and the number of second memory arrays 212-1, . . . , 212-N. Controller 208 can communicate with the first memory array 210 and the number of second memory arrays 212-1, . . . , 212-N to sense (e.g., read), program (e.g., write), move, and/or erase data, among other operations.

Controller 208 can be included on the same physical device (e.g., the same die) as memories 210 and 212-1, . . . , 212-N. Alternatively, controller 208 can be included on a separate physical device that is communicatively coupled to the physical device that includes memories 210 and 212-1, . . . , 212-N. In an embodiment, components of controller 208 can be spread across multiple physical devices (e.g., some components on the same die as the memory, and some components on a different die, module, or board) as a distributed controller.

Host 202 can include a host controller to communicate with memory device 206. The host controller can send commands to memory device 206 via interface 204. The host controller can communicate with memory device 206 and/or the controller 208 on the memory device 206 to read, write, and/or erase data, among other operations.

Controller 208 on memory device 206 and/or the host controller on host 202 can include control circuitry and/or logic (e.g., hardware and firmware). In an embodiment, controller 208 on memory device 206 and/or the host controller on host 202 can be an application specific integrated circuit (ASIC) coupled to a printed circuit board including a physical interface. Also, memory device 206 and/or host 202 can include a buffer of volatile and/or non-volatile memory and a number of registers.

For example, as shown in FIG. 2, memory device can include circuitry 214. In the embodiment illustrated in FIG. 2, circuitry 214 is included in controller 208. However, embodiments of the present disclosure are not so limited. For instance, in an embodiment, circuitry 214 may be included in (e.g., on the same die as) memory 210 and/or memories 212-1, . . . , 212-N (e.g., instead of in controller 208).

Circuitry 214 can comprise, for instance, hardware, and can perform wear leveling operations to relocate data stored in memory array 210 and/or memory arrays 212-1, . . . , 212-N in accordance with the present disclosure. For example, circuitry 214 can relocate the data of the first portion of data that is associated with a particular one of the first number of LBAs to one of the two separation blocks, and can relocate the data of the second portion of data that is associated with a particular one of the second number of LBAs to the other one of the two separation blocks.

For instance, circuitry 214 can relocate the data of the first portion that is associated with the last one of the first number of LBAs (e.g., the last LBA in the first sequence of LBAs) to the second separation block (e.g., the separation block that is after the second portion and before the first portion), and circuitry 214 can relocate the data of the second portion that is associated with the last one of the second number of LBAs (e.g., the last LBA in the second sequence of LBAs) to the first separation block (e.g., the separation block that is after the first portion and before the second portion). Such a data relocation may result in two different physical blocks of the memory having no valid data stored therein (e.g., may result in two different physical blocks of the memory becoming the separation blocks). For instance, relocating the data of the first portion associated with the last one of the first number of LBAs may result in a different physical block becoming the separation block that is after the second portion and before the first portion, and relocating the data of the second portion associated with the last one of the second number of LBAs may result in a different physical block becoming the separation block that is after the first portion and before the second portion. Further, relocating the data of the first portion associated with the last one of the first number of LBAs may result in a different one of the first number of LBAs (e.g., the next-to-last LBA in the first sequence of LBAs) becoming the last one of the first number of LBAs, and relocating the data of the second portion associated with the last one of the second number of LBAs may result in a different one of the second number of LBAs (e.g., the next-to-last LBA in the second sequence of LBAs) becoming the last one of the second number of LBAs. An example illustrating such a data relocation operation will be further described herein (e.g., in connection with FIGS. 3 and 4).

In an embodiment, circuitry 214 may perform an operation to relocate the data responsive to a triggering event. The triggering event may be, for example, a particular number of program operations, such as, for instance, 100 program operations, being performed (e.g., executed) on the memory. For instance, a counter (not shown in FIG. 2) can be configured to send an initiation signal in response to the particular number of program operations being performed, and circuitry 214 may perform the operation to relocate the data in response to receiving the initiation signal from the counter. As an additional example, the triggering event may be a power state transition occurring in the memory, such as, for instance, memory device 206 going from active mode to stand-by mode, idle mode, or power-down mode.

In an embodiment, the data of the second portion may be relocated immediately upon the data of the first portion being relocated. However, in some instances, the operation to relocate the data may need to be suspended in order to perform an operation, such as a program or sense operation, requested by host 202. In such an instance, the operation requested by the host can be performed upon the data of the first portion being relocated (e.g., upon the relocation of the data being completed), and the data of the second portion may be relocated upon the requested operation being performed (e.g., upon the operation being completed).

Once the data as been relocated, circuitry 214 can use algebraic mapping to identify the physical location in the memory to which the data has been relocated. For example, circuitry 214 can use algebraic mapping (e.g., algebraic logical to physical mapping) to identify (e.g., compute) the location in the memory (e.g., the PBA) of the physical block to which the data of the first portion has been relocated (e.g., the location of the second separation block), and the location in the memory (e.g., the PBA) of the physical block to which the data in the second portion of the memory has been relocated (e.g., the location of the first separation block). For instance, circuitry 214 can use the algebraic mapping to identify the location in the memory of the physical block to which the data of the first portion has been relocated during an operation to sense that relocated data (e.g., upon receiving a request from host 202 to read one of the first number of LBAs), and to identify the location in the memory of the physical block to which the data of the second portion has been relocated during an operation to sense that relocated data (e.g., upon receiving a request from host 202 to read one of the second number of LBAs). Such an algebraic mapping will be further described herein (e.g., in connection with FIG. 3).

Circuitry 214 can perform additional (e.g., subsequent) wear leveling operations to further relocate the data stored in memory array 210 and/or memory arrays 212-1, . . . , 212-N throughout the lifetime of the memory. For instance, circuitry 214 can perform an additional (e.g., subsequent) operation to relocate the data responsive to an additional (e.g., subsequent) triggering event.

For example, in an operation to relocate data in the memory that is performed subsequent to the example operation previously described herein, circuitry 214 can relocate the data of the first portion that is associated with the different one of the first number of LBAs that has now become the last one (e.g., the one that was previously the next-to-last LBA in the first sequence of LBAs) to the different physical block that has now become the separation block that is after the second portion and before the first portion, and circuitry 214 can relocate the data of the second portion that is associated with the different one of the second number of LBAs that has now become the last one (e.g., the one that was previously the next-to-last LBA in the second sequence of LBAs) to the different physical block that has now become the separation block that is after the first portion and before the second portion. Such a data relocation may once again result in two different physical blocks of the memory becoming the separation blocks, and different ones of the first and second number of LBAs becoming the last one of the first and second number of LBAs, respectively, and subsequent data relocation operations can continue to be performed in an analogous manner. An example illustrating a sequence of such subsequent data relocation operations will be further described herein (e.g., in connection with FIGS. 5A-5B).

The embodiment illustrated in FIG. 2 can include additional circuitry, logic, and/or components not illustrated so as not to obscure embodiments of the present disclosure. For example, memory device 206 can include address circuitry to latch address signals provided over I/O connectors through I/O circuitry. Address signals can be received and decoded by a row decoder and a column decoder, to access memory arrays 210 and 212-1, . . . , 212-N. Further, memory device 206 can include a main memory, such as, for instance, a DRAM or SDRAM, that is separate from and/or in addition to memory arrays 210-1 and 212-1, . . . , 212-N.

Figure 3:
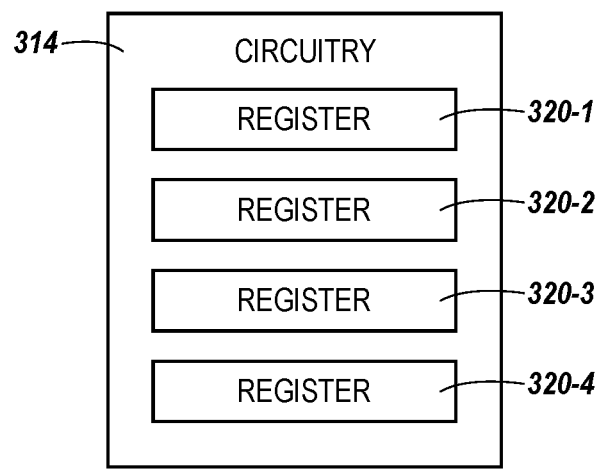
FIG. 3 is a block diagram of circuitry for performing data relocation operations in memory in accordance with an embodiment of the present disclosure.

FIG. 3 is a block diagram of circuitry 314 for performing data relocation operations in memory in accordance with an embodiment of the present disclosure. Circuitry 314 can be, for example, circuitry 214 previously described in connection with FIG. 2.

As shown in FIG. 3, circuitry 314 can include four registers (e.g., a first register 320-1, a second register 320-2, a third register 320-3, and a fourth register 320-4). Register 320-1 can store a value indicating (e.g., pointing to) the PBA for the data of the first portion of the memory that is associated with the first one of the first number of LBAs (e.g., the first LBA in the first sequence of LBAs). This value can be referred to herein as "$S_A$".

Register 320-2 can store a value indicating the PBA for one of the two physical blocks of the memory that do not have data stored therein, and register 320-3 can store a value indicating the PBA for the other one of the two physical blocks that do not have data stored therein. For example, register 320-2 can store a value indicating the PBA for the physical block that is after the first portion of data and before the second portion of data (e.g., the first separation block), and register 320-3 can store a value indicating the PBA for the physical block that is after the second portion and before the first portion (e.g., the second separation block). The value stored by register 320-2 can be referred to herein as "$g_A$", and the value stored by register 320-3 can be referred to herein as "$g_B$".

Register 320-4 can store a value indicating the relative position of the first one of the second number of LBAs (e.g., the first LBA in the second sequence of LBAs) in the second portion of the data of the memory. This value can be referred to herein as "$r_B$."

Circuitry 314 can use the values stored in registers 320-1, 320-2, 320-3, and 320-4 (e.g., $S_A$, $g_A$, $g_B$, and $r_B$) to perform a data relocation operation in memory accordance with the present disclosure. For instance, circuitry 314 can use the below example of code, representing executable instructions, to perform a data relocation operation in accordance with the present disclosure. In the below example, "$n_{PBA}$" represents the total number (e.g., quantity) of PBAs in the memory, "$n_A$" represents the total number of LBAs associated with the first portion of data (e.g., the first number of LBAs), "$n_B$" represents the total number of LBAs associated with the second portion of data (e.g., the second number of LBAs), and "sep" represents the number of PBAs for each respective separation block.

1: procedure STEP
2: Do StepB
3: Do StepA
4: end procedure
1: procedure StepB
2: Move the content of the PBA $g_B$−1 (mod $n_{PBA}$) into $g_A$+sep−1 (mod $n_{PBA}$)

3: $g_B \leftarrow g_B - 1 \pmod{n_{PBA}}$
4: $r_B \leftarrow r_B + 1 \pmod{n_B}$
5: end procedure
1: procedure StepA
2: Move the content of the PBA $g_A - 1 \pmod{n_{PBA}}$ into $g_B + \text{sep} \pmod{n_{PBA}}$
3: $g_A \leftarrow g_A - 1 \pmod{n_{PBA}}$
4: if $g_A = S_A$ then
5: $S_A \leftarrow S_A + n_B + 2\text{sep} \pmod{n_{PBA}}$
6: end if
7: end procedure Further, circuitry 314 can use the values stored in registers 320-1, 320-2, 320-3, and 320-4 (e.g., $S_A$, $g_A$, $g_B$, and $r_B$) to perform an algebraic mapping (e.g., an algebraic logical to physical mapping) to identify the physical location in the memory (e.g., the PBA) to which the data has been relocated (e.g., during a sense operation, as previously described herein). For instance, circuitry 314 can compute the PBA, represented below as "p", for any LBA, represented below as "l", associated with the first portion of data using the below "First Portion Mapping", and circuitry 314 can compute the PBA for any LBA associated with the second portion of data using the below "Second Portion Mapping":

First Portion Mapping $$p = \begin{cases} (l + S_A) \bmod n_{PBA} & \text{if } ((l + S_A) \bmod n_{PBA} < g_A) \text{ OR} \\ & (g_A < S_A) \\ (l + S_A + 2sep + n_B) \bmod n_{PBA} & \text{else} \end{cases}$$

where $l \in \{0, \ldots, n_A - 1\}$

Figure 4:
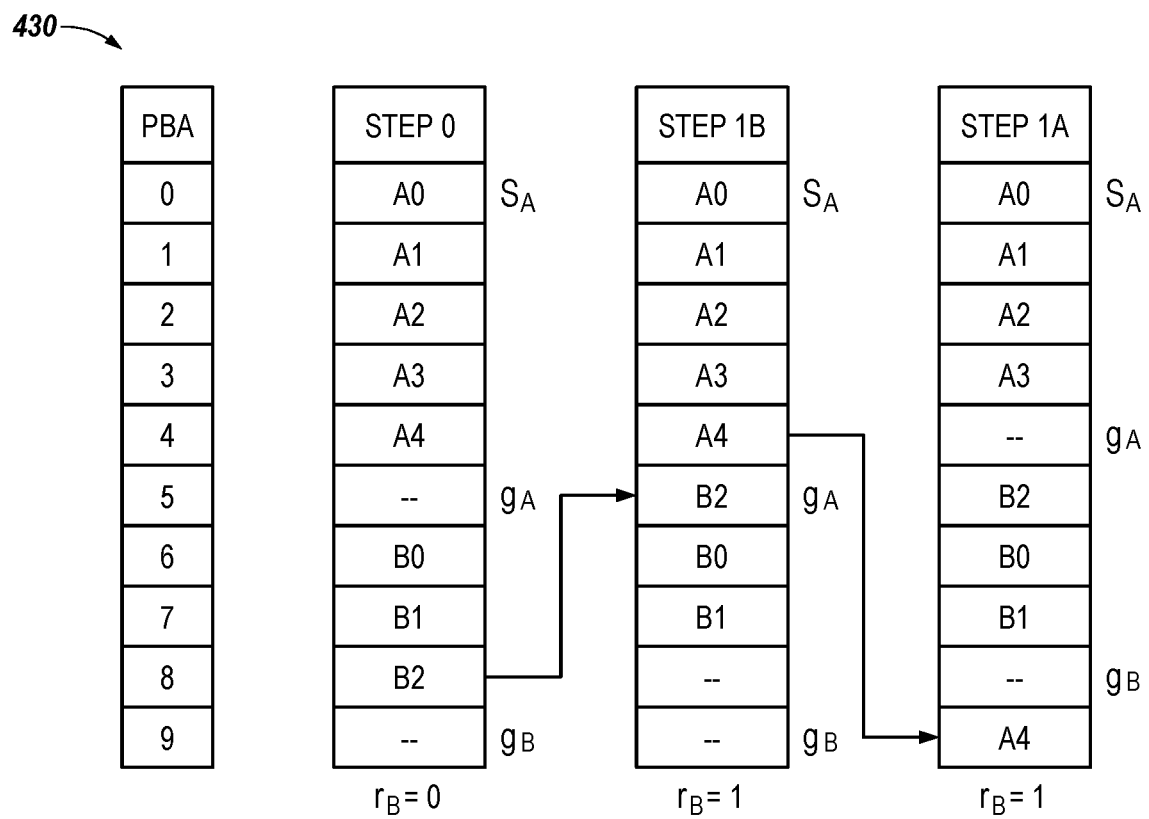
FIG. 4 illustrates a conceptual example of a data relocation operation performed in memory in accordance with an embodiment of the present disclosure.

Second Portion Mapping
$p = (l + m) \bmod n_B + g_A + \text{sep}) \bmod n_{PBA}$
where $l \in \{0, \ldots, n_B - 1\}$ FIG. 4 illustrates a conceptual example 430 of a data relocation operation performed in memory in accordance with an embodiment of the present disclosure. The memory may be, for example, memory array 210 and/or memory arrays 212-1, ..., 212-N previously described in connection with FIG. 2, and the data relocation operation may be performed by, for example, circuitry 214 and/or 314 previously described in connection with FIGS. 2 and 3, respectively.

In the example illustrated in FIG. 4, the memory includes ten physical blocks of memory cells, represented by PBAs 0 through 9 (e.g., PBA 0 corresponds to the first physical block, PBA 1 corresponds to the second physical block, PBA 2 corresponds to the third physical block, etc.). Further, in the example illustrated in FIG. 4, the memory includes (e.g., is separated and/or divided into) two different portions (e.g., logical regions) of data, which can be referred to as portion A and portion B. As shown in FIG. 4, the data of portion A has five LBAs associated therewith (e.g., LBAs A0 through A4), and the data of portion B has three LBAs associated therewith (e.g., LBAs B0 through B2). In the example illustrated in FIG. 4, the LBA size is the same for portion A and portion B. Further, "$S_A$" shown in FIG. 4 indicates the PBA for the data of portion A associated with LBA A0, and "$r_B$" shown in FIG. 4 indicates the relative position of LBA B0 in portion B (e.g., the relative position of LBA B0 in the sequence of LBAs associated with portion B).

Further, in the example illustrated in FIG. 4, two of the physical blocks of the memory do not have valid data stored therein, and separate (e.g., are between) portion A and portion B. These blocks may be referred to as separation blocks (as previously described herein), and are represented in FIG. 4 by a "--" symbol. In the example illustrated in FIG. 4, "$g_A$" indicates the PBA for the separation block that is after portion A and before portion B, and "$g_B$" indicates the PBA for the separation block that is after portion B and before portion A.

In the example illustrated in FIG. 4, each respective separation block comprises one PBA, which is the same size as the LBA sizes for portions A and B. However, in an example in which the LBA sizes for portions A and B are different, such as, for instance, in which the size of one portion is a multiple of the other, the number of PBAs in each separation block may be equal to that multiple. For instance, if the LBA size for portion B is equal to the PBA size, but the LBA size for portion A is four PBAs, the number of PBAs in each separation block would be four.

The column labelled "Step 0" in FIG. 4 shows the data allocation within the memory before the data relocation operation is performed. For instance, as illustrated in FIG. 4, before the data relocation operation is performed the data of portion A is located in PBAs 0 through 4, the data of portion B is located in PBAs 6 through 8, the separation block that is after portion A and before portion B is located at PBA 5 (e.g., as indicated by $g_A$), and the separation block that is after portion B and before portion A is located at PBA 9 (e.g., as indicated by $g_B$). Further, the relative position of LBA B0 in portion B before the data relocation operation is performed is first (e.g., LBA B0 is first in the sequence of LBAs associated with portion B, as indicated by the value for $r_B$), as illustrated in FIG. 4.

The data relocation operation can be divided into two substeps, which are represented by the "Step 1B" and "Step 1A" columns in FIG. 4. As shown in FIG. 4, during the first substep (e.g., Step 1B), the data of portion B associated with the last of the LBAs of portion B (e.g., the data associated with LBA B2) is relocated to the separation block that is after portion A and before portion B (e.g., to the separation block indicated by $g_A$). That is, the first substep (e.g., Step 1B) moves the data associated with the last of the LBAs of portion B up, to be before the first of the LBAs of portion B (e.g., the data associated with LBA B2 is moved up to be before the data associated with LBAs B0 and B1). During the second substep (e.g., Step 1A), the data of portion A associated with the last of the LBAs of portion A (e.g., the data associated with LBA A4) is relocated to the separation block that is after portion B and before portion A (e.g., to the separation block indicated by $g_B$), as illustrated in FIG. 4. That is, the second substep moves the data associated with last of the LBAs of portion A down, to be after the LBAs of portion B (e.g., the data associated with LBA A4 is moved down to be after the data associated with LBAs B2, B0, and B1).

As a result of the data relocation operation (e.g., after Steps 1B and 1A are performed), PBA 4 becomes the separation block that is after portion A and before portion B, and PBA 8 becomes the separation block that is after portion B and before portion A, as illustrated in FIG. 4 (e.g. as indicated by $g_A$ and $g_B$, respectively, after Step 1B). Also as a result of the data relocation operation, the next-to-last of the LBAs of portion A (e.g., LBA A3) becomes the last of the LBAs of portion A before portion B, and the next-to-last of the LBAs of portion B (e.g., LBA B1) becomes the last of the LBAs of portion B, as illustrated in FIG. 4). Also as a result of the data relocation operation, the data of portion A becomes located in PBAs 0 through 3 and 9, and the data of portion B becomes located in PBAs 5 through 7, as illustrated in FIG. 4. Also as a result of the data relocation operation, the relative position of LBA B0 in portion B becomes second (e.g., LBA B0 becomes second in the sequence of LBAs associated with portion B, as indicated by the value for $r_B$), as illustrated in FIG. 4.

In the example illustrated in FIG. 4, each subset is run once during the data relocation operation. However, in an example in which the LBA sizes for portions A and B are different, such as, for instance, in which the size of one portion is a multiple of the other, Step 1A and/or Step 1B may need to be run more than once. For instance, in an example in which the LBA size for portion B is equal to the PBA size, but the LBA size for portion A is four PBAs, Step 1B would be run four times, and Step 1A would be run once.

FIG. 5A illustrates a conceptual example 540 of a sequence of data relocation operations performed in memory in accordance with an embodiment of the present disclosure. The memory is analogous to the memory previously described in connection with FIG. 4, and the data relocation operations may be performed by, for example, circuitry 214 and/or 314 previously described in connection with FIGS. 2 and 3, respectively. FIG. 5B is a table 545 of values for $S_A$, $g_A$, $g_B$, and $r_B$ associated with the sequence of data relocation operations. $S_A$, $g_A$, $g_B$, and $r_B$ are analogous to $S_A$, $g_A$, $g_B$, and $r_B$, respectively, previously described in connection with FIG. 4. Each "Step" column in FIGS. 5A and 5B represents the effect of performing both substep B and subset A (e.g., "Step 1" is the combination of substep 1B and substep 1A described in connection with FIG. 4).

The column labelled "Step 0" in FIG. 5A shows the data allocation within the memory before the first data relocation operation of the sequence is performed, and is analogous to the "Step 0" column described in connection with FIG. 4. For example, as shown in FIG. 5B, the values for $S_A$, $g_A$, $g_B$, and $r_B$ in the Step 0 column (e.g., before the first data relocation operation is performed) are 0, 5, 9, and 0, respectively, as described in connection with FIG. 4.

The columns labelled "Step 1" through "Step 6" in FIG. 5A show the data allocation within the memory after the performance of each respective data relocation operation in the sequence. For example, the Step 1 column shows the data allocation after the performance of the first data relocation operation, and is analogous to the combined effect of substep 1B and substep 1A described in connection with FIG. 4. The Step 2 column shows the data allocation after the performance of the second data relocation operation, the Step 3 column shows the data allocation after the performance of the third data relocation operation, etc. Further, the columns labelled "Step 1" through "Step 6" in FIG. 5B show the values for $S_A$, $g_A$, $g_B$, and $r_B$ after the performance of each respective data relocation operation in the sequence. For example, the data allocation and values shown in the Step 1 columns in FIGS. 5A and 5B, respectively, are analogous to the data allocation and $S_A$, $g_A$, $g_B$, and $r_B$ values after the relocation operation described in connection with FIG. 4.

As shown in the Step 2 column of FIG. 5A, after the performance of the second data relocation operation in the sequence, the data of portion B that was associated with the last of the LBAs of portion B after Step 1 (e.g., the data associated with LBA B1) is relocated to the separation block that was after portion A and before portion B after Step 1 (e.g., to PBA 4), and the data of portion A that was associated with the last of the LBAs of portion A after Step 1 (e.g., the data associated with LBA A3) is relocated to the separation block that was after portion B and before portion A after Step 1 (e.g., to PBA 8). Further, as shown in the Step 2 column of FIG. 5A, PBA 3 has become the separation block that is after portion A and before portion B, and PBA 7 has become the separation block that is after portion B and before portion A, as indicated by the values for $g_A$ and $g_B$, respectively, in the Step 2 column of FIG. 5B. Further, as shown in the Step 2 column of FIG. 5A, the LBA that was the next-to-last of the LBAs of portion A after Step 1 (e.g., LBA A2) has become the last of the LBAs of portion A before portion B, and the LBA that was the next-to-last of the LBAs of portion B after Step 1 (e.g., LBA B0) has become the last of the LBAs of portion B. Further, as shown in the Step 2 column of FIG. 5A, the data of portion A has become located in PBAs 0 through 2 and 8 through 9, and the data of portion B has become located in PBAs 4 through 6, with the PBA for the data of portion A associated with LBA A0 remaining at PBA 0, as indicated by the value for $S_A$ in the Step 2 column of FIG. 5B. Further, as shown in the Step 2 column of FIG. 5A, the relative position of LBA B0 in portion B has become third, as indicated by the value for m in the Step 2 column of FIG. 5B.

As shown in the Step 3 column of FIG. 5A, after the performance of the third data relocation operation in the sequence, the data of portion B that was associated with the last of the LBAs of portion B after Step 2 (e.g., the data associated with LBA B0) is relocated to the separation block that was after portion A and before portion B after Step 2 (e.g., to PBA 3), and the data of portion A that was associated with the last of the LBAs of portion A after Step 2 (e.g., the data associated with LBA A2) is relocated to the separation block that was after portion B and before portion A after Step 2 (e.g., to PBA 7). Further, as shown in the Step 2 column of FIG. 5A, PBA 2 has become the separation block that is after portion A and before portion B, and PBA 6 has become the separation block that is after portion B and before portion A, as indicated by the values for $g_A$ and $g_B$, respectively, in the Step 3 column of FIG. 5B. Further, as shown in the Step 3 column of FIG. 5A, the LBA that was the next-to-last of the LBAs of portion A after Step 2 (e.g., LBA A1) has become the last of the LBAs of portion A, and the LBA that was the next-to-last of the LBAs of portion B after Step 2 (e.g., LBA B2) has become the last of the LBAs of portion B. Further, as shown in the Step 3 column of FIG. 5A, the data of portion A has become located in PBAs 0 through 1 and 7 through 9, and the data of portion B has become located in PBAs 3 through 5, with the PBA for the data of portion A associated with LBA A0 remaining at PBA 0, as indicated by the value for $S_A$ in the Step 3 column of FIG. 5B. Further, as shown in the Step 3 column of FIG. 5A, the relative position of LBA B0 in portion B has become first, as indicated by the value for m in the Step 3 column of FIG. 5B.

The fourth, fifth, and sixth data relocation operations of the sequence can continue in an analogous manner, as shown in the Step 4, Step 5, and Step 6 columns, respectively, in FIGS. 5A and 5B. As such, it can be seen that the effect of the data relocation operations is to sequentially move the data associated with the last of the LBAs of portion B up to be before the first of the LBAs of portion B, and sequentially move the data associated with last of the LBAs of portion A down to be after the LBAs of portion B, such that portion B moves up and portion A moves down throughout the operation of the memory. Accordingly, not only do the data relocation operations of the sequence move the data associated with each respective LBA to a different PBA throughout the operation of the memory, but the two different portions of data are not static (e.g., the PBAs at which the data of each respective portion are located continue to change throughout the operation of the memory). That is, the data of each respective portion may be relocated across the entire memory throughout the operation of the memory.

Each respective data relocation operation in the sequence can be performed responsive to a separate triggering event, as previously described herein (e.g., in connection with FIG. 2). Although the example sequence illustrated in FIGS. 5A-5B includes six data relocation operations, embodiments of the present disclosure are not so limited. For instance, additional data relocation operations can continue to be performed (e.g., responsive to subsequent triggering events) in an analogous manner throughout the lifetime of the memory.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a plurality of physical blocks of memory cells, wherein:
the memory includes a first portion of data having a first number of logical block addresses associated therewith, and a second portion of data having a second number of logical block addresses associated therewith; and
two of the plurality of physical blocks of memory cells do not have data stored therein, wherein the two of the plurality of physical blocks of memory cells that do not have data stored therein separate the first portion of data and the second portion of data in the memory; and
circuitry configured to:
relocate the data of the first portion that is associated with a last logical block address of the first number of logical block addresses to one of the two of the plurality of physical blocks of memory cells that do not have data stored therein; and
relocate the data of the second portion that is associated with a last logical block address of the second number of logical block addresses to the other one of the two of the plurality of physical blocks of memory cells that do not have data stored therein.

2. The apparatus of claim 1, wherein:
the first portion of data comprises user data; and
the second portion of data comprises system data.

3. The apparatus of claim 1, wherein:
the first portion of data comprises data that has been accessed at or above a particular frequency during program or sense operations performed on the memory; and
the second portion of data comprises data that has been accessed below the particular frequency during program or sense operations performed on the memory.

4. The apparatus of claim 1, wherein:
the first portion of data comprises operating system data; and
the second portion of data comprises multimedia data.

5. The apparatus of claim 1, wherein the circuitry comprises hardware.

6. A method of operating memory, comprising:
relocating data included in a first portion of the memory and associated with a last logical block address of a number of logical block addresses of the first portion of the memory to a physical block of the memory that has no data stored therein; and
relocating data included in a second portion of the memory and associated with a last logical block address of a number of logical block addresses of the second portion of the memory to another physical block of the memory that has no data stored therein, wherein the two physical blocks of memory that have no data stored therein separate the first portion of the memory and the second portion of the memory.

7. The method of claim 6, wherein the method includes:
using algebraic mapping to identify a location in the memory of physical block to which the data in the first portion of the memory has been relocated; and
using algebraic mapping to identify a location in the memory of the other physical block to which the data in the second portion of the memory has been relocated.

8. The method of claim 7, wherein the method includes:
using the algebraic mapping to identify the location in the memory of the physical block to which the data in the first portion of the memory has been relocated during an operation to sense that relocated data; and
using the algebraic mapping to identify the location in the memory of the other physical block to which the data in the second portion of the memory has been relocated during an operation to sense that relocated data.

9. The method of claim 6, wherein the method includes relocating the data included in the first portion of the memory and relocating the data included in the second portion of the memory responsive to a triggering event.

10. The method of claim 9, wherein the triggering event is a particular number of program operations being performed on the memory.

11. The method of claim 9, wherein the triggering event is a power state transition occurring in the memory.

12. The method of claim 6, wherein;
relocating the data included in the first portion of the memory to the physical block of the memory results in a third physical block of the memory having no data stored therein; and
relocating the data included in the second portion of the memory to the other physical block of the memory results in a fourth physical block of the memory having no data stored therein; and the method further includes:
  relocating data included in the first portion of the memory and associated with a different one of the number of logical block addresses of the first portion of the memory to the third physical block of the memory; and
  relocating data included in the second portion of the memory and associated with a different one of the number of logical block addresses of the second portion of the memory to the fourth physical block of the memory.

13. An apparatus, comprising:
  a memory having a plurality of physical blocks of memory cells, wherein:
    the memory includes a first portion of data having a first number of logical block addresses associated therewith, and a second portion of data having a second number of logical block addresses associated therewith; and
    two of the plurality of physical blocks of memory cells do not have data stored therein and separate the first portion of data and the second portion of data in the memory;
  circuitry configured to:
    relocate the data of the first portion that is associated with a last logical block address of the first number of logical block addresses to one of the two of the plurality of physical blocks of memory cells that do not have data stored therein; and
    relocate the data of the second portion that is associated with a last logical block address of the second number of logical block addresses to the other one of the two of the plurality of physical blocks of memory cells that do not have data stored therein.

14. The apparatus of claim 13, wherein the first number of logical block addresses is different than the second number of logical block addresses.

15. The apparatus of claim 13, wherein a size of each respective one of the first number of logical block addresses is different than a size of each respective one of the second number of logical block addresses.

16. The apparatus of claim 13, wherein the circuitry is included in the memory.

17. The apparatus of claim 13, wherein the circuitry is included in a controller of the apparatus.

18. The apparatus of claim 13, wherein the circuitry includes:
  a first register configured to store a value indicating a physical block address for the data of the first portion that is associated with a first one of the first number of logical block addresses;
  a second register configured to store a value indicating a physical block address for one of the two of the plurality of physical blocks of memory cells that do not have data stored therein;
  a third register configured to store a value indicating a physical block address for the other one of the two of the plurality of physical blocks of memory cells that do not have data stored therein; and
  a fourth register configured to store a value indicating a relative position of a first one of the second number of logical block addresses in the second portion of data.

19. A method of operating memory, comprising:
  relocating data included in a first portion of the memory and associated with a last logical block address of a number of logical block addresses of the first portion of the memory to a physical block of the memory that has no data stored therein and is before the first portion of the memory in the memory; and
  relocating data included in a second portion of the memory and associated with a last logical block address of a number of logical block addresses of the second portion of the memory to a physical block of the memory that has no data stored therein and is after the second portion of the memory in the memory.

20. The method of claim 19, wherein the method includes:
  using algebraic mapping to identify a physical block address for the physical block to which the data associated with the last logical block address of the number of logical block addresses of the first portion of the memory has been relocated; and
  using algebraic mapping to identify a physical block address for the physical block to which the data associated with the last logical block address of the number of logical block addresses of the second portion of the memory has been relocated.

21. The method of claim 19, wherein the number of logical block addresses for the first portion of the memory and the number of logical block addresses for the second portion of the memory are randomized.

22. The method of claim 19, wherein;
  relocating the data included in the first portion of the memory results in:
    a different physical block of the memory having no data stored therein and being before the first portion of the memory in the memory; and
    a different one of the number of logical block addresses of the first portion of the memory becoming the last logical block address of the number of logical block addresses of the first portion of the memory; and
  relocating the data included in the second portion of the memory results in:
    a different physical block of the memory having no data stored therein and being before the second portion of the memory in the memory; and
    a different one of the number of logical block addresses of the second portion of the memory becoming the last logical block address of the number of logical block addresses of the second portion of the memory; and
  the method further includes:
    relocating data included in the first portion of the memory and associated with the different one of the number of logical block addresses of the first portion of the memory to the different physical block of the memory that has no data stored therein and is before the first portion of the memory; and
    relocating data included in the second portion of the memory and associated with the different one of a number of logical block addresses of the second portion of the memory to the different physical block of the memory that has no data stored therein and is before the second portion of the memory.

23. The method of claim 19, wherein the method includes relocating the data included in the second portion of the memory immediately upon relocating the data included in the first portion of the memory.

24. The method of claim 19, wherein the method includes:
  performing an operation on the memory upon relocating the data included in the first portion of the memory; and
  relocating the data included in the second portion of the memory upon performing the operation on the memory.

* * * * *